United States Patent [19]

Hietala

[11] Patent Number: 5,495,206

[45] Date of Patent: *Feb. 27, 1996

[54] FRACTIONAL N FREQUENCY SYNTHESIS WITH RESIDUAL ERROR CORRECTION AND METHOD THEREOF

[75] Inventor: Alexander W. Hietala, Cary, Ill.

[73] Assignee: Motorola, Inc., Schaumburg, Ill.

[*] Notice: The term of this patent shall not extend beyond the expiration date of Pat. No. 5,166,642.

[21] Appl. No.: 146,257

[22] Filed: Oct. 29, 1993

[51] Int. Cl.⁶ .............................. H03C 3/09; H03L 7/197
[52] U.S. Cl. .............................. 331/1 A; 331/10; 331/25; 331/16; 455/76; 455/260; 375/376; 327/156; 327/159; 327/105; 327/107
[58] Field of Search .................... 331/14, 16, 17, 331/23, 10, 25, 1 A; 332/127, 128; 375/374, 376; 455/260, 76, 113; 327/105, 107, 106

[56] References Cited

U.S. PATENT DOCUMENTS

| | | | |
|---|---|---|---|
| 4,024,464 | 5/1977 | Underhill et al. | 331/10 |
| 4,179,670 | 12/1979 | Kingsbury | 331/10 |
| 4,204,174 | 5/1980 | King | 331/10 |
| 4,573,023 | 2/1986 | Cok et al. | 331/1 A |
| 4,686,488 | 8/1987 | Attenborough | 331/2 |
| 4,743,867 | 5/1988 | Smith | 332/127 |
| 4,758,802 | 7/1988 | Jackson | 331/10 |
| 4,800,342 | 1/1989 | Jackson | 331/10 |
| 4,810,977 | 3/1989 | Flugstad et al. | 332/19 |
| 4,815,018 | 3/1989 | Reinhardt et al. | 364/701 |
| 4,816,774 | 3/1989 | Martin | 331/1 A |
| 4,870,384 | 9/1989 | Thomas | 332/123 |
| 5,038,120 | 8/1991 | Wheatley et al. | 332/128 |
| 5,055,802 | 10/1991 | Hietala | 331/16 |
| 5,093,632 | 3/1992 | Hietala et al. | 331/1 A |
| 5,166,642 | 11/1092 | Hietala | 331/1 A |
| 5,166,642 | 11/1992 | Hietala | 331/1 A |
| 5,339,050 | 8/1994 | Llewellyn | 331/16 |

FOREIGN PATENT DOCUMENTS

| | | |
|---|---|---|
| 0340870 | 11/1989 | European Pat. Off. . |
| 0429217A2 | 5/1991 | European Pat. Off. . |
| 0438867A3 | 7/1991 | European Pat. Off. . |
| 0038520 | 10/1991 | European Pat. Off. . |
| 9012458 | 10/1990 | WIPO ........ 331/18 |
| WO91/07824 | 11/1990 | WIPO . |

OTHER PUBLICATIONS

"A Use of Double Integration in Sigma Delta Modulaion," IEEE Transactions on Communications, vol. Com 33 No. 3 Mar., 1985 pp. 249–258 J. Candy.

Primary Examiner—Robert J. Pascal
Assistant Examiner—Arnold Kinkead
Attorney, Agent, or Firm—Kirk W. Dailey

[57] ABSTRACT

A frequency synthesizer (107) utilizes a variable oscillator (114) the output of which is used as the frequency synthesizer output (115) and is fed to a digital divider (108). The output of the digital divider (108) feeds one input of a phase comparator (109). The other input of the phase comparator (109) is fed from a reference oscillator (116). A phase comparator (109) output controls the variable oscillator (114). The digital divider (108) has a division ratio that is varied with time by a multi accumulator fractional-N division system (112) such that the effective division ratio may be varied by non-integer steps. Due to the time varying division sequence applied to the digital divider (108) there is a residual spurious level on the output signal (115). A second digital sequence from the multiple accumulator fractional. N-division system (112) is generated to reduce this spurious level and is applied to the output of the phase comparator (109).

9 Claims, 5 Drawing Sheets

FRACTIONAL N FREQUENCY SYNTHESIS WITH RESIDUAL ERROR CORRECTION AND METHOD THEREOF

FIELD OF THE INVENTION

Generally, this invention relates to frequency synthesis and more specifically this invention relates to frequency synthesis using fractional division techniques.

BACKGROUND OF THE INVENTION

Generally, radio frequency (RF) communication systems include at least two communication units. Each communication unit includes a transceiver for sending and receiving RF signals over one of a plurality of RF channels. Each transceiver includes a frequency synthesizer for generating RF signals.

In frequency synthesis it is desirable to achieve the selected frequency output in as little time as possible with any spurious outputs minimized. The spurious outputs in question are usually associated with a phase detector and occur at the frequency of operation of the phase detector which is equal to the channel spacing in a non-fractional phase locked loop. Thus the phase locked loop bandwidth must be small relative to the channel spacing to minimize the spurious outputs. Reducing the loop bandwidth will increase the time required to achieve the selected frequency.

Fractional N division can overcome this problem by allowing the phase detector to operate at a much higher frequency for the same channel spacing. This allows the phase locked loop bandwidth to be much larger and thus the required lock time is much less. Two examples of fractional division systems can be seen in U.S. Pat. No. 5,093,632 entitled "Latched Accumulator Fractional N Synthesis with Residual Error Correction" authored by Hietala et al and U.S. Pat. No. 5,166,642 entitled "Multiple Accumulator Fractional N Synthesis with Series Recombination" and authored by Hietala. In a limiting case the fractional division scheme can use a very large fractionalization such that the residual spurs will appear as increased sideband noise instead of discrete spurs.

Any fractional division system is not perfect in that there will be residual spurs at the frequency step spacing or excessively increased sideband noise for the limiting case mentioned above. This will occur since the fractional system creates a somewhat randomized sequence to move the main loop divider such that the average frequency is correct. Therefore the fractional sequence contains the desired frequency offset information with an additional residual noise term.

Increasing the number of accumulators and the rate at which the accumulators operate can reduce the amplitude of the residual noise waveform and break up the spurious output at a given offset frequency. Eventually a point will be reached at which the number of accumulators and the rate of their operation cannot be further increased due to speed limitations or limitations of the divider. Thus every system will reach a limit of spurious performance even with a fractional division scheme.

In some systems this spurious limit will not be acceptable. These residual spurs can be further reduced by using a D/A converter to convert some combination of the internal contents of the accumulators into analog form and then apply this analog signal to the loop filter through a coupling capacitor. Such a system is shown for a simple one accumulator case in FIG. 1.

Such a residual error correction system is not well suited for integrated circuit design since the selection of the capacitor will be critical and, even if an accurate capacitor value could be had, the resulting circuit would not maintain the required balance between the divider control port and the residual error correction port over temperature, make tolerance, and aging.

Therefore it would be advantageous to devise a residual error correction method for a fractional N synthesis which can be realized in integrated circuit form and is tolerant to variations in temperature, make tolerance, and aging. Additionally, it would be advantageous for the residual error correction method to improve spurious performance for the number of accumulators and the rate at which they operate.

DESCRIPTION OF A PREFERRED EMBODIMENT

The preferred embodiment of the present invention is employed in a frequency synthesizer in which a variable oscillator output is fed to a digital divider. The digital divider has a digital division ratio. The output of the digital divider feeds one input of a phase comparison network. The other input of the phase comparison network is fed from a reference oscillator. The phase comparison network output is filtered to remove extraneous noise components and is then fed to a control input of the variable oscillator. The control input is such that the variable oscillator output frequency will adjust itself until it is equal to the reference oscillator frequency times the digital division ratio.

The division ratio of the digital divider is varied with time by a multi accumulator fractional N division system such that the effective division ratio may be varied by non-integer steps. The division ratio is then programmed to realize the desired channel frequency, the desired modulation waveform, and any automatic frequency correction offset.

Due to the time varying division sequence applied to the digital divider there will be a residual spurious level on the output signal of the synthesizer. This residual spurious level is further reduced by generating a second digital sequence based on the internal state of the multiple accumulator fractional N division system and applying this second sequence directly to a charge pump circuit, or modulator of the phase detector.

Figure 1:
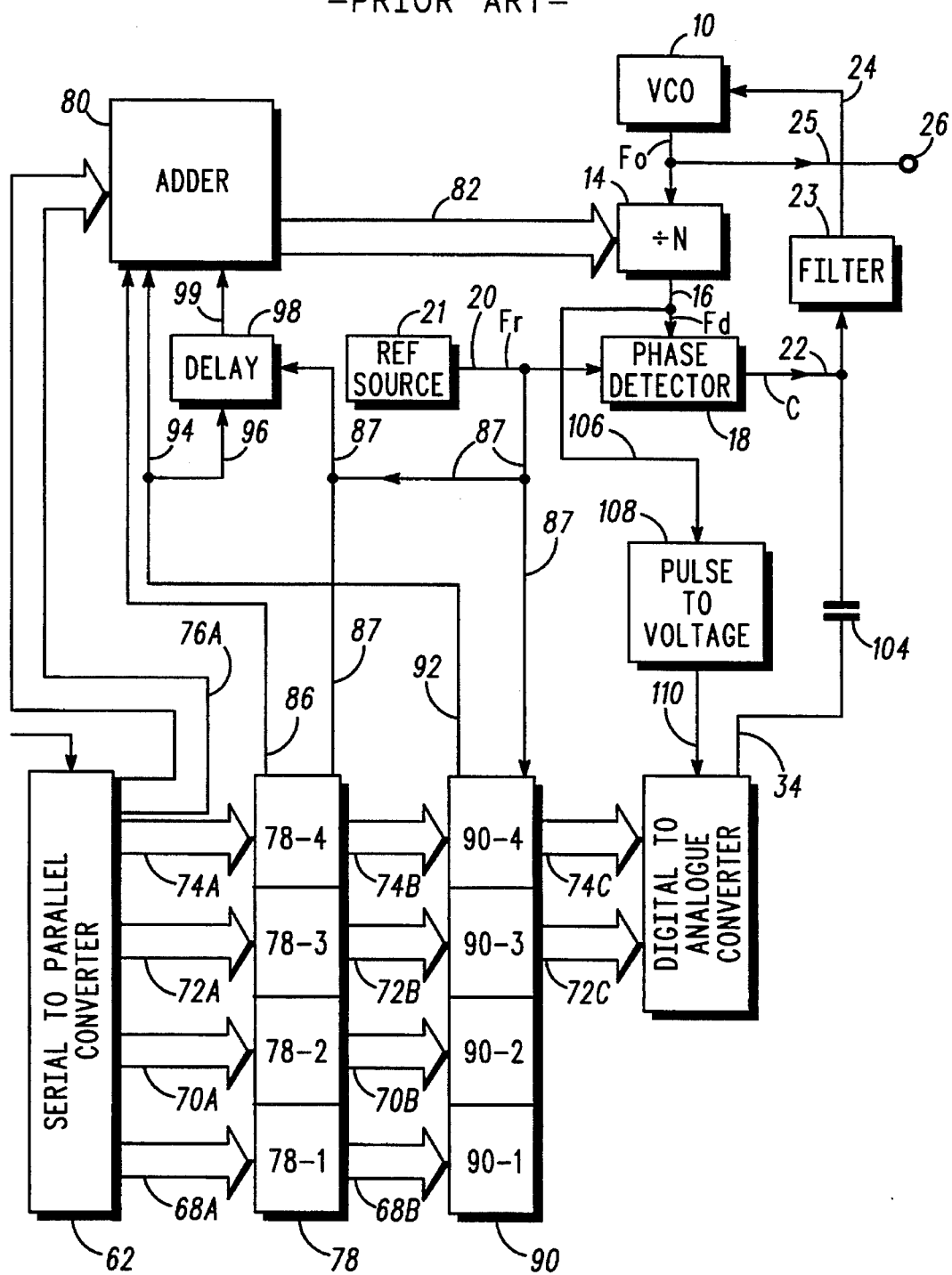
FIG. 1 is an illustration in block diagram form of a fractional N frequency synthesis employing a prior art residual error correction.
Figure 2:
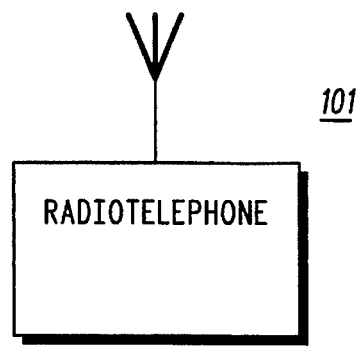
FIG. 2 is an illustration in block diagram form of a radiotelephone which may employ the present invention.

In integrated circuit technology the ratio of two components may be determined with high accuracy. However the absolute value of a single component will vary widely between individual lots of the IC. Thus a system such as the prior art of FIG. 1 will not lend itself to integration since the absolute value of the coupling capacitor must be fixed. The frequency synthesizer disclosed herein is conducive to integration because the gain of the residual correction term as compared to the gain of the phase detector is defined by a ratio of resistor values (180, 181 of FIG. 6). If the basic current of the charge pump were to increase (and thus the gain of the phase detector increases) due to fabrication variances, then the current of the residual correction would increase by a proportional amount and thus would still provide the correct correction level at the new charge pump current level. FIG. 2 is an illustration in block diagram form of a radiotelephone 101. In the preferred embodiment, the radiotelephone 101 is a radiotelephone developed to operate in a cellular phone system such as the Global System for Mobile Communications (GSM) cellular radio telephone system, such as the model #SLF1770B/PD of a GSM radiotelephone available from Motorola, Inc.

Figure 3:
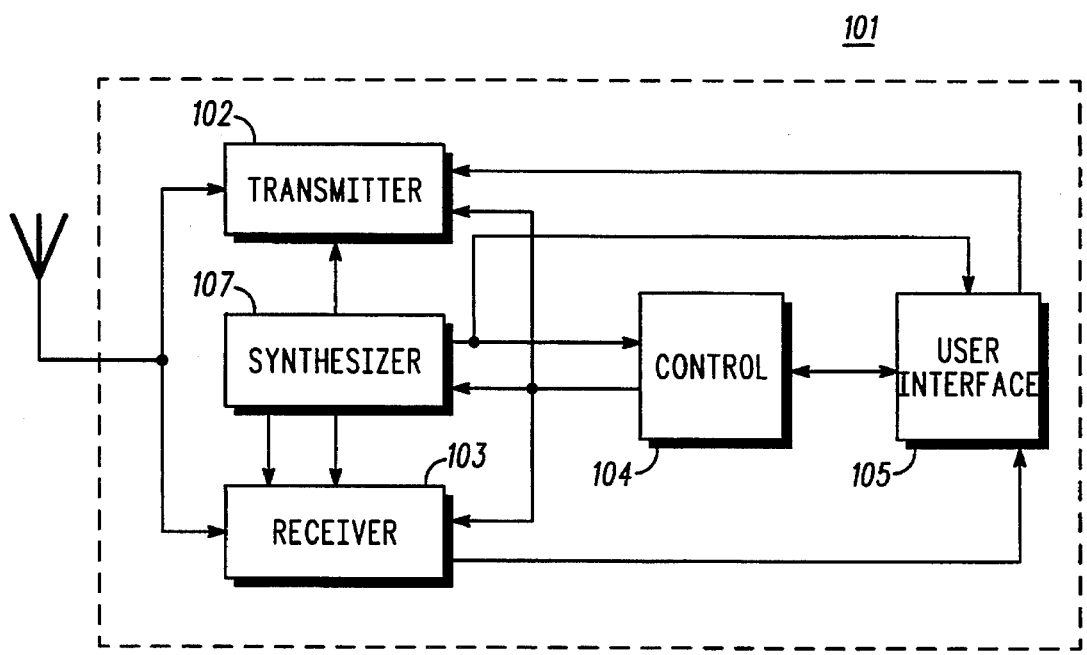
FIG. 3 is a more detailed illustration in block diagram form of a radiotelephone in accordance with the present invention.

FIG. 3 is a more detailed illustration in block diagram form of the radiotelephone 101. The radiotelephone 101 includes a transmitter 102, a receiver 103, a control system 104, a user interface 105, and a synthesizer 107. The synthesizer 107 provides the receiver 103 and the transmitter 102 with signals, tuned to a desired frequency, to allow the reception and transmission of data from user interface 105 to a remote transceiver of the radiotelephone communication system. Additionally, the synthesizer 107 provides the user interface 105 and the control logic 104 with the necessary clock signal for proper operation of the logic circuits contained within these blocks.

Figure 4:
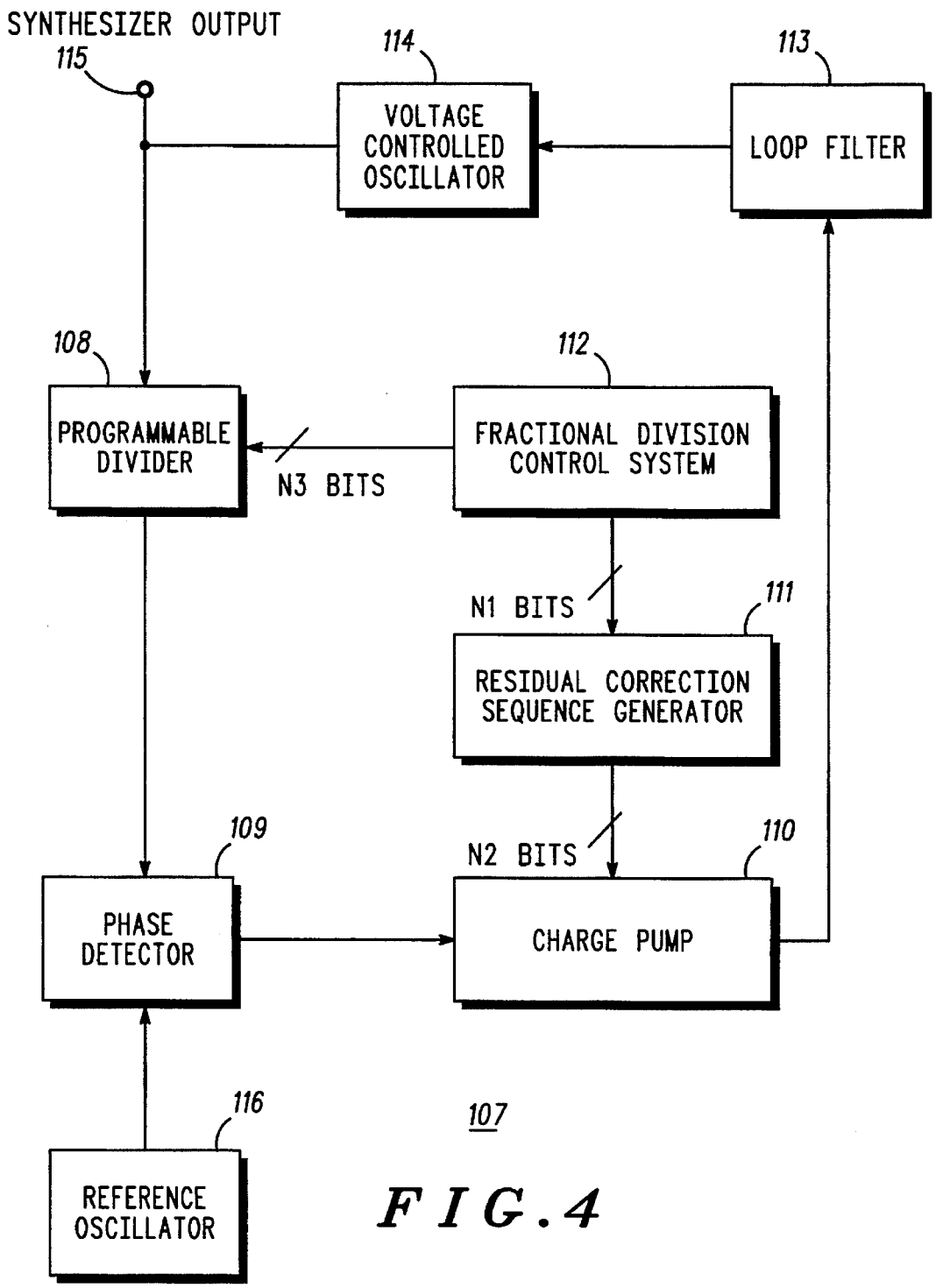
FIG. 4 is an illustration in block diagram form of a frequency synthesizer in accordance with the present invention.

FIG. 4 is an illustration in block diagram form of the frequency synthesizer 107 illustrated in FIG. 3. The synthesizer output 115 is coupled to an input of a programmable divider 108, the programmable divider is in turn coupled to one input of a phase detector 109. A second input of phase detector 109 is obtained from a reference oscillator 116. An output of the phase detector 109 is proportional to the phase error between the two input signals. The output of the phase detector 109 is input to a charge pump 110. The charge pump 110 provides current pulses used to charge or discharge a loop filter 113. The loop filter 113 generates an output voltage which is used as a control input for a voltage controlled oscillator 114. Finally the output of voltage controlled oscillator 114 is used as the synthesizer output 115, thus completing the phase locked loop.

A programming input of the programmable divider 108 is driven by a digital sequence of width N3 bits generated by a fractional division control system 112. The digital sequence provides non-integer value division ratio to the programmable divider 108, thus, reducing the minimum step size of the synthesizer output 115.

Additionally, a residual correction sequence generator 111 operates on N1 internal bits of the fractional division control system 112 to create a digital sequence which represents the noise terms in the digital sequence. The N2 bits output from residual correction sequence generator 111 are then applied directly to the charge pump 110. The N2 bits cause the current versus time to be modulated so as to cancel the residual noise terms generated by fractional division control system 112.

The terms N1, N2, and N3 are a method of notation used to represent three digital sequences containing three different bit widths. In the preferred embodiment, N1=4 bits wide, N2=8 bits wide, and N3=8 bits wide. The specific numbers do not represent any significant portion of the claimed invention and may vary depending upon the implementation of the invention in a particular system.

Figure 5:
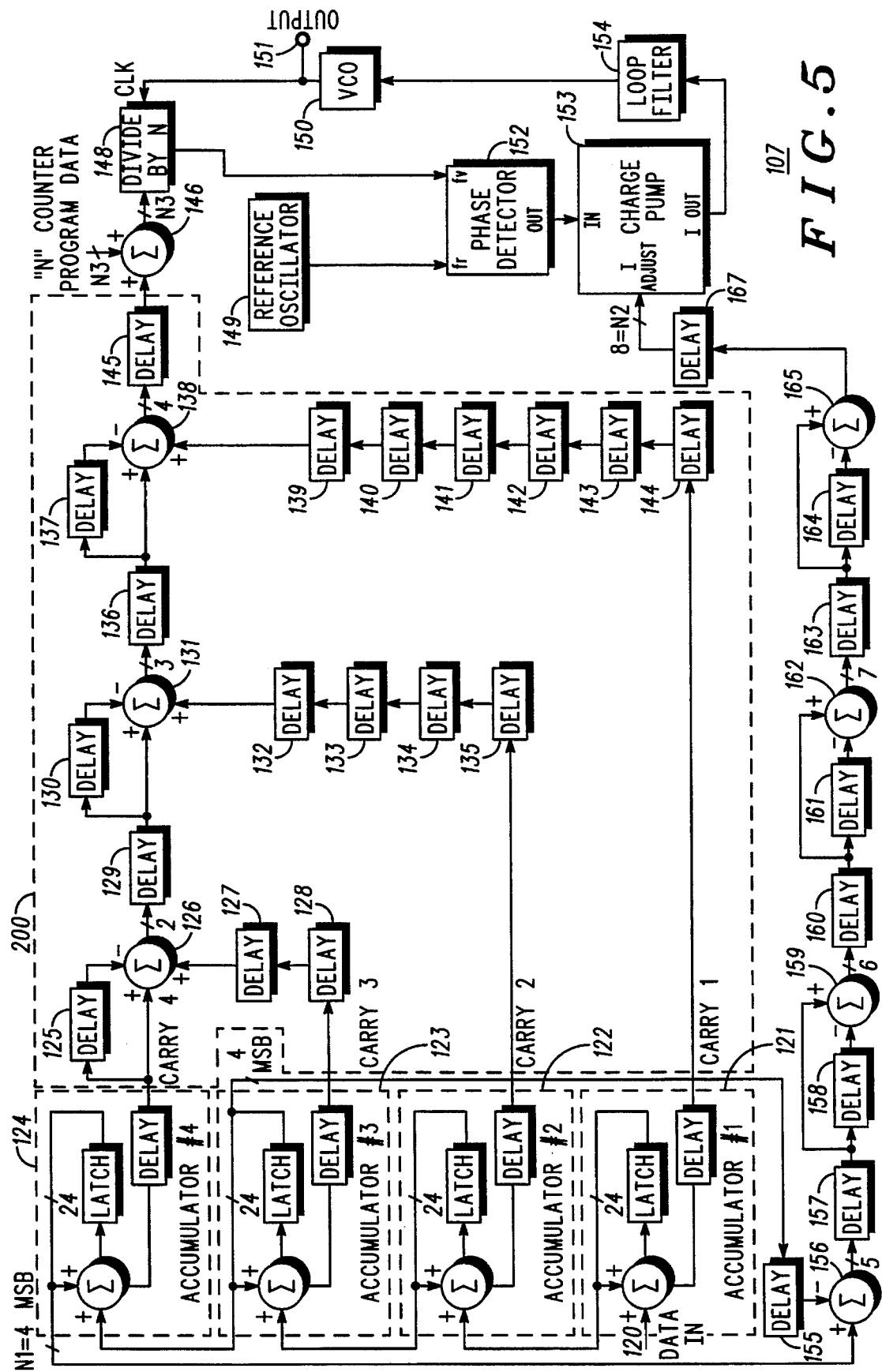
FIG. 5 is a detailed illustration in block diagram form of a frequency synthesizer in accordance with the present invention.

FIG. 5 is a detailed illustration in block diagram form of a specific implementation of the frequency synthesizer 107. In the preferred embodiment, the multiple accumulator system utilized in the frequency synthesizer is described in U.S. Pat. No. 5,166,642. However, any other equally sufficient multiple accumulator system may be substituted therefor, resulting in a similar mathematical result.

Data 120, which corresponds to frequency offset, is fed into the first accumulator 121. Each accumulator beyond the first is fed with the contents of the next lower order accumulator. In this manner each accumulator is performing a digital integration of the contents of the accumulator of next lower order with the first accumulator 121 performing a digital integration of the input data 120. Thus, the second accumulator 122 performs a double integral of the input data 120, the third accumulator 123 performs a triple integral of the input data 120, and the fourth accumulator 124 performs a quadruple integral of the input data 120.

The output of each accumulator is the carry or overflow output. These outputs represent the frequency offset data 120 and integrals of the data. A digital derivative network consisting of delay element 125 and adder 126 is connected to the carry output of the fourth accumulator 124. The output of this derivative network is cascaded through two more digital derivative networks composed of delay elements 130 and 137 and adders 131 and 138. The net effect is that the output of the fourth accumulator 124 after passing through three digital derivatives is now a higher order correction to the frequency offset and may be added to the output of the first accumulator 121 in adder 138.

The carry outputs of the second accumulator 122 and the third accumulator 123 are added into the digital derivative cascade at the proper point such that these carry output also provide higher order corrections to the frequency offset. Various additional delay elements are added to this structure to insure that the carry output sequences are properly aligned and that the adders used in the digital derivative network are isolated from each other so that the adder delays do not add and slow the maximum frequency of operation. All the digital derivative networks and associated delay elements are collectively referred to as a digital derivative system 200.

The output of the digital derivative system 200 is added to the programmable divider frequency data in adder 146. The resulting N3 bit data sequence is applied to the programmable divider 148. The data sequence represents the desired frequency offset and a residual noise term.

In a general $N^{th}$ order system as described above, the data sequence output from the fractional division control system can be derived in the linearized Z transform model as:

$$DO = z^{-2N} DI + z^{-N}(1-z^{-1})^N QN$$

Where DI is the input frequency offset data 120 and QN is the residual noise term.

The internal contents of any accumulator may be derived as:

$$DI(X) = z^{-x}DI - z^{-x}Q1 - z^{31\ (x-1)}Q2 - z^{-(x-2)}Q3 - \ldots - z^{-1}QX$$

where X is the order of the accumulator.

If the contents of this accumulator are subtracted from the contents of the next lowest order accumulator then the following term is obtained:

$$DI(X) - z^{-1}DI(X-1) = -z^{-1}QX$$

Therefore, the residual error term can be recreated in a digital form by subtracting the delayed contents of the second highest order accumulator from the contents of the highest order accumulator and differentiating the result N−1 times.

In FIG. 5 the 4 most significant bits of the second highest order accumulator 123 are delayed once by delay element 155 and then subtracted from the 4 most significant bits of the highest order accumulator 124 at adder 156. This results in a term equal to $-z^{-1}Q4$ at the output of adder 156. Delay elements 157, 158 and adder 159 form a digital derivative network. The output of adder 159 will be $-z^{-2}(1-z^{-1})Q4$. Delay elements 160, 161 and adder 162 form a second digital derivative network. The output of adder 162 will be $-z^{-3}(1-z^{-1})^2Q4$. Delay elements 163, 164 and adder 165 form a third digital derivative network. The output of adder 165 will be $-z^{-4}(1-z^{-1})^3Q4$. Finally this output of adder 165 is passed through digital delay element 167 to result in $-z^{-5}(1-z^{-1})^3Q4$. This term will then be applied to the charge pump 153 with an effective gain of $K_{\phi,residual}$.

Now returning to the sequence applied to the divider 148. Since the phase detector 152 compares phase and not frequency, the signal output from divider 148 will be effectively integrated upon passing through the phase detector 152. Thus the phase term at the phase detector output can be represented in the Z transform domain as:

$$\phi_{o1} = \frac{z^{-8}DI}{1-z^{-1}} \frac{K_\phi}{N_L} + z^{-4}(1-z^{-1})^3 \frac{K_\phi}{N_L} Q4$$

where: $K\phi$ is the phase detector conversion gain.
and: $N_L$ is the average division (N*P+A+Num/Dem)

To this one more delay must be added to account for the delay from programming the divider 148 until the output of the divider 148 is sent to the phase detector 152.

$$\phi_{o1} = \frac{z^{-9}DI}{1-z^{-1}} \frac{K_\phi}{N_L} + z^{-5}(1-z^{-1})^3 \frac{K_\phi}{N_L} Q4$$

The residual noise correction term from delay element 167 can be represented in the Z transform domain as:

$$\phi_{o2} = -(z^{-5}(1-z^{-1})^3 K_{\phi,residual})Q4$$

If the value of $K_{\phi,residual}$ is chosen to be equal to the phase detector gain divided by the average loop division then a perfect cancellation of any residual noise terms may be achieved.

Figure 6:
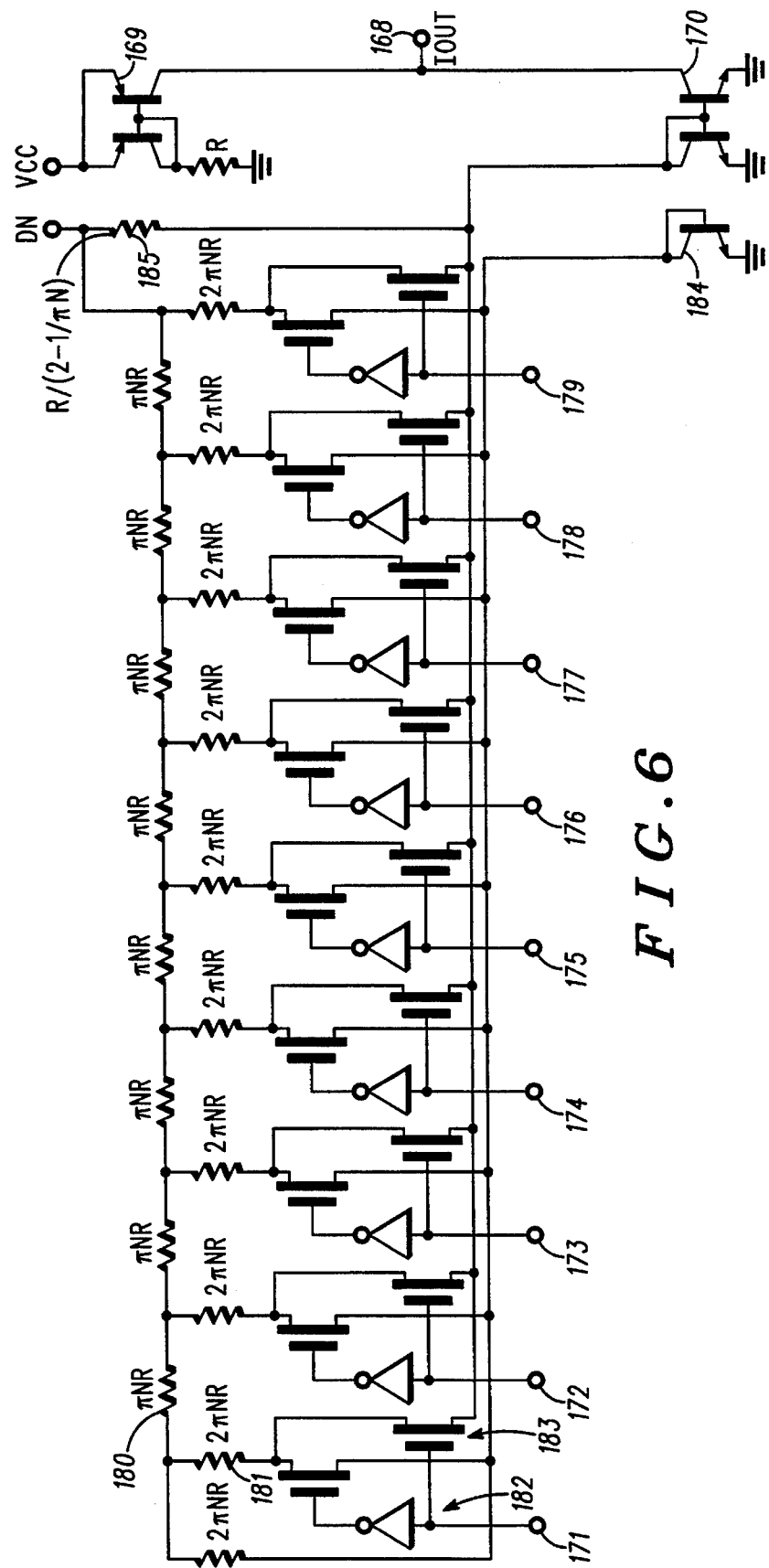
FIG. 6 is a detailed illustration in block diagram form of a charge pump, also commonly referred to as a modulator in accordance with the present invention.

FIG. 6 is a detailed illustration in block diagram form of the charge pump 153 in accordance with the preferred embodiment of the present invention. Other equally sufficient charge pumps may be substituted by one of average skill in the art. This type of charge pump would be used with a dual state phase detector. (Other similar circuits can be defined for tri-state phase detectors.) Current source 169 is continuously turned on. Current sink 170 is turned on 50% of the time when the phase locked loop is locked and has a current equal to twice that of current source 169. This results in a square wave of current at output 168 with a net charge transfer of zero to the loop filter when the loop is locked.

To this basic structure an "R-2R ladder" type of circuit is added to the control path of current sink 170. This structure creates a current in each "rung of the ladder" which is one-half the current in the next higher "rung". Thus a binary word may be input to such a structure to program an analog current based on a digital word. For schematic representation purposes each rung of the ladder is controlled by an inverter 182 which routes the current in the rung through one of two paths switched by transmission gates 183. Each of the inverters 182 is controlled by one bit of the data sequence defined by the residual correction sequence generator 171 through 179. One output of the two possible paths for the rung currents is added to current sink 170. The other path is passed to ground through transistor 184. Thus the inputs 171 through 179 modulate the current level of current sink 170 and provide a method of adding the residual error correction signal to the phase detector output.

The residual error correction gain must equal the phase detector gain $K_{100}$ divided by the average division ratio for cancellation. The phase detector gain is $I_\phi/2\Pi$ so the maximum current out of the ladder structure will be the charge pump current required by the normal loop divided by $2\Pi N_L$. One half of this current must be subtracted from the nominal current setting resistor for current sink 170. This results in the resistor values chosen for resistors 180, 181, and 185.

Resistor 185 would normally be equal to R/2 so that the current in current sink 170 (=2*VDN−VBE)/R) would be double that in current sink 169. In the residual correction scheme, as shown here, an additional current is passed through the R-2R ladder structure. When the residual error is set to zero then the data bits will be 10000000. The total current in the ladder is then (VDN-VBE)/πNR. To preserve the charge pump 110 in the same condition as without error correction, this current must be subtracted from the main current path such that the sum of the two currents equals 2*(VDN-VBE)/R once again. Thus 2*(VDN-VBE)/R−(VDN-VBE)/πNR=(VDN-VBE)*(2/R−1/πNR). From this and Ohm's Law resistor 185 becomes R/(2−1/πN)).

The minimum current through the resistor ladder is 0 corresponding to 00000000 or maximum negative correction. The maximum current through the ladder is 2*(VDN-VBE)/πNR corresponding to 11111111 or maximum positive current. If the residual error is positive then one unit is 10000001, if it is negative then one unit is 01111111, thus, the first (MSB) bit is used as a sign of for the current correction.

What is claimed is:

1. A frequency synthesizer having a controllable oscillator for generating a first signal having a first frequency, the frequency synthesizer comprising:
   means for creating a divider sequence signal, the divider sequence signal containing a desired value and an error value, the means for creating comprises:
   means for accepting a frequency offset signal,
   first means for integrating the frequency offset signal, forming a first integrated signal and a first carry signal,
   second means for integrating the first integrated signal forming a second integrated signal and a second carry signal,
   first means for derivating the second carry signal, forming a derivated second carry signal,
   means for combining said derivated second carry signal with said first carry signal, forming a first combined signal, means for derivating said first combined signal, forming a first derivated combined signal, and means for combining said first derivated combined signal with a programmable divider frequency divider signal, creating a divider sequence signal;

means for dividing the first frequency of the first signal, the means for dividing dependent upon the divider sequence signal and forming a first divided signal;

means for detecting a difference in phase of a reference signal and the first divided signal and generating a phase difference signal;

means for approximating an error contained in the first divided signal at least due in part to the error value in the divider sequence signal and forming a first error correction signal; and means for modulating the phase difference signal with the first error correction signal and generating a modulated signal having reduced residual error and for controlling the controllable oscillator.

2. A frequency synthesizer in accordance with claim 1 further comprising means for filtering, responsive to means for modulating, the modulated signal.

3. A frequency synthesizer in accordance with claim 1 wherein said means for approximating the error further comprises:

means for combining the first integrated signal with the second integrated signal forming a second combined signal; and means for derivating said second combined signal forming said first error correction signal.

4. A fractional-N frequency synthesizer accepting a first signal to select a controllable oscillator output signal frequency by dividing the output signal frequency with a variable divisor divider controlled by a divider sequence signal from an accumulator network creating a divided signal, the divider sequence signal containing a desired value and an error value, the fractional-N synthesizer comprising:

an error correction signal generator for approximating the error contained in the divider sequence signal and generating an error correction signal;

a phase detector coupled to the divided signal output from the variable divisor divider for detecting a difference in phase of a reference signal and the divided signal and generating a phase difference signal;

a modulator coupled to the phase difference signal output from the phase detector for modulating the phase difference signal with the error correction signal and generating a modulated signal having reduced residual error;

and a controllable oscillator for accepting the modulated signal and generating an output signal having a predetermined frequency.

5. A fractional-N frequency synthesizer comprising:

a controllable oscillator outputting a first signal having a first frequency and accepting a modulated signal for controlling the first frequency of the first signal;

an accumulator network creating a divider sequence signal, the divider sequence signal containing a desired value and an error value;

a divider having a signal input and a control input and a signal output, the first signal coupled to the signal input of the divider, the divider sequence signal coupled to the control input of the divider for controlling a variable divisor divider, the variable divisor divider for dividing the first frequency of the first signal and generating a first divided signal;

an error correction signal generator for approximating an error contained in the divider sequence signal at least due in part to the error value in the divider sequence signal and generating an error correction signal;

a phase detector coupled to the divided signal output from the variable divisor divider for detecting a difference in phase of a reference signal and the divided signal and generating a phase difference signal; and a modulator coupled to the phase difference signal output from the phase detector for modulating the phase difference signal with the error correction signal and generating the modulated signal having reduced residual error.

6. A method of frequency synthesizing, the frequency synthesizer having a controllable oscillator for generating a first signal having a first frequency, the method comprising the steps of:

creating a divider sequence signal, the divider sequence signal containing a desired value and an error value;

dividing the frequency of the first signal, the step of dividing dependent upon the divider sequence signal and forming a first divided signal having a phase;

detecting a difference in phase of a reference frequency and the divided signal and generating a phase difference signal;

approximating an error contained in the first divided signal at least due in part to the error value in the divider sequence signal and forming a first error correction signal; and modulating the phase difference signal with the first error correction signal and generating a modulated signal having reduced residual error and for controlling the controllable oscillator.

7. A method of frequency synthesizing in accordance with claim 6 further comprising a step of filtering, responsive to said step of modulating, the modulated signal.

8. A method of frequency synthesizing in accordance with claim 6 wherein said step of creating a divider sequence signal further comprises the steps of:

accepting a frequency offset signal;

integrating the frequency offset signal, forming a first integrated signal and a first carry signal;

integrating the first integrated signal forming a second integrated signal and a second carry signal;

derivating the second carry signal, forming a derivated second carry signal;

combining said derivated second carry signal with said first carry signal, forming a first combined signal;

derivating said first combined signal, forming a first derivated combined signal; and combining said first derivated combined signal with a programmable divider frequency divider signal, forming a divider sequence signal.

9. A method of frequency synthesizing in accordance with claim 8 wherein said step of approximating the error further comprises:

combining the first integrated signal with the second integrated signal forming a second combined signal; and derivating said second combined signal forming said first error correction signal.

* * * * *